(12) United States Patent
Sekiya et al.

(10) Patent No.: US 6,514,425 B1
(45) Date of Patent: Feb. 4, 2003

(54) DRY ETCHING GAS

(75) Inventors: Akira Sekiya, Tsukuba (JP); Tetsuya Takagaki, Tokyo (JP); Shinsuke Morikawa, Yokohama (JP); Shunichi Yamashita, Tokyo (JP); Tsuyoshi Takaichi, Tokyo (JP); Yasuo Hibino, Kawagoe (JP); Yasuhisa Furutaka, Settsu (JP); Masami Iwasaki, Tokyo (JP); Norifumi Ohtsuka, Tokyo (JP)

(73) Assignees: Agency of Industrial Science and Technology, Tokyo (JP); The Mechanical Social Systems Foundation of Mita Building, Tokyo (JP); Electronic Industries Association of Japan, Tokyo (JP); Asahi Glass Co., Ltd., Tokyo (JP); Daikin Industries, Ltd. of Umeda Center Building, Osaka (JP)

( * ) Notice: Subject to any disclaimer, the term of this patent is extended or adjusted under 35 U.S.C. 154(b) by 0 days.

(21) Appl. No.: 09/297,320

(22) PCT Filed: Nov. 5, 1997

(86) PCT No.: PCT/JP97/04028

§ 371 (c)(1), (2), (4) Date: Jul. 2, 1999

(87) PCT Pub. No.: WO98/20526

PCT Pub. Date: May 14, 1998

(30) Foreign Application Priority Data

Nov. 5, 1996 (JP) ................................. 8-308742

(51) Int. Cl.$^7$ ................................. C03C 15/00
(52) U.S. Cl. ................ 216/67; 216/79; 216/80; 252/79.1; 438/723
(58) Field of Search .................. 252/79.1; 216/67, 216/79, 80

(56) References Cited

U.S. PATENT DOCUMENTS

| | | | | |
|---|---|---|---|---|
| 4,415,404 A | * | 11/1983 | Riegl | 156/635 |
| 4,581,101 A | * | 4/1986 | Senoue et al. | 156/643 |
| 5,368,687 A | | 11/1994 | Sandhu et al. | 156/664 |
| 5,626,775 A | * | 5/1997 | Roberts et al. | 216/67 |
| 6,149,828 A | * | 11/2000 | Vaartstra | 216/57 |
| 6,159,859 A | * | 12/2000 | Robertson, III et al. | 438/706 |

FOREIGN PATENT DOCUMENTS

| | | |
|---|---|---|
| EP | 536747 | 4/1993 |
| EP | 774778 | 5/1997 |

* cited by examiner

*Primary Examiner*—Allan Olsen
(74) *Attorney, Agent, or Firm*—Lorusso & Loud

(57) ABSTRACT

Disclosed is fluorocarbon-based dry etching gas which is free of global environmental problems and a dry etching method using a plasma gas obtained therefrom. The dry etching gas includes a fluorinated ether of carbon, fluorine, hydrogen and oxygen and having 2–6 carbon atoms.

2 Claims, 1 Drawing Sheet

DRY ETCHING GAS

TECHNICAL FIELD

This invention relates to a dry etching gas and a plasma processing method for a material to be processed using the gas.

BACKGROUND ART

A dry etching technique, which is capable of forming fine patterns in the production of IC, is utilized for the production of super LSI, etc. in lieu of wet etching.

For dry etching a semiconductor material such as silicon dioxide (hereinafter also referred to as $SiO_2$), a mixed $CF_4$ and $H_2$ gas, $CHF_3$, $C_2F_6$, $C_3F_8$, $C_4F_8$ or a mixture thereof is used as an etching gas for the purpose of sufficiently increasing an etching rate ratio of the $SiO_2$ to silicon (hereinafter also referred to as Si) or polysilicon (hereinafter also referred to as polySi) on which the $SiO_2$ is formed. The above fluorine-containing gases, such as $CF_4$, $CHF_3$, $C_2F_6$ and $C_3F_8$, however, have a long life in atmosphere and a large global warming potential. Namely, when discharged to air, these gases retain without being decomposed for a long period of time and contribute to warming of earth as a greenhouse effect gas (hereinafter referred to as GHG).

The global warming is the most important problem among various currently alarmed global environmental problems. Climatic Change Framework Treaty has been adopted 1992 for the prevention of global warming. Detailed methods of restricting GHG and schedule therefor are now discussed in meetings of contracting states of the Treaty.

To cope with the global warming problem, various methods for reducing GHG are investigated with the simultaneous development of various techniques for substitutes for GHG.

Up to now, however, no effective substitutes have been found for conventional etching gas for semiconductors. Thus, the current trend is toward the decomposition of exhaust gases discharged after etching steps so as to reduce the emission of GHG to air.

It is an object of the present invention to provide a dry etching gas which is free of global environment problems such as global warming and a plasma processing method for a material to be processed using the dry etching gas.

DISCLOSURE OF THE INVENTION

The present inventors have made an earnest study for solving the above-described problem and, as a result, have found that the problem can be solved by using an organic compound constituted of carbon, fluorine, hydrogen and oxygen and having 2–6 carbon atoms and thus completed the present invention.

Namely, according to the present invention, there is provided a dry etching gas comprising an organic compound constituted of carbon, fluorine, hydrogen and oxygen and having 2–6 carbon atoms.

The present invention also provides a plasma processing method for a material to be processed, characterized in that the material is processed with a plasma gas obtained from the above-described dry etching gas.

BEST MODE FOR CARRYING OUT THE INVENTION

Figure 1:
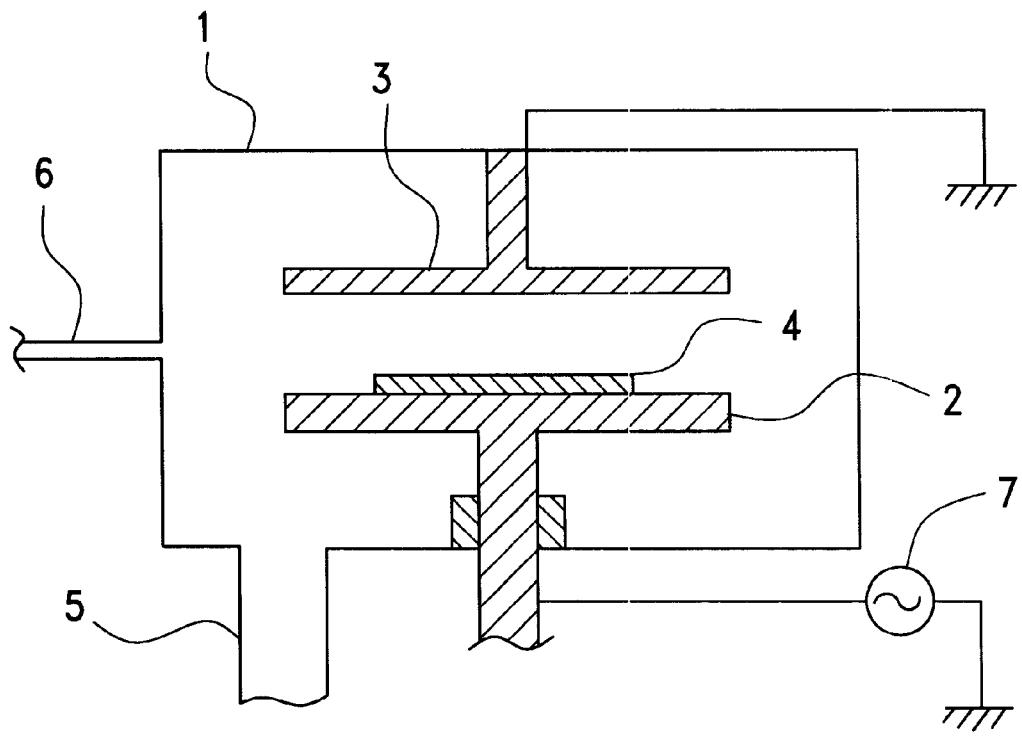
FIG. 1 is a schematic illustration of one embodiment of a dry etching device used for the present invention.

The dry etching gas used in the present invention comprises an organic compound constituted of carbon, fluorine, hydrogen and oxygen and having 2–6 carbon atoms. The organic compound has a boiling point of not higher than 80° C., preferably not higher than 20° C.

The organic compound is preferably a hydrofluoroether. The present inventors have investigated a relationship between the atomic composition of the hydrofluoroether and the etching effect and have found that excellent etching effect is obtained by using the hydrofluoroether which satisfies with the following formula (1):

$$[C]/([F]+[O]-[H])<0.8. \tag{1}$$

The value R of $[C]/([F]+[O]-[H])$ is preferably in the range of 0.7–0.4, more preferably 0.6–0.4. When the value R is 0.8 or more, the amount of a fluorocarbon polymer film depositing on a surface of a material to be processed increases during etching so that the efficiency of etching of the material to be processed is adversely affected.

Illustrative of suitable hydrofluoroethers are $CHF_2OCF_3$ (R=0.4), $CF_3CHFOCF_3$ (R=0.43) and $CHF_2CF_2OCF_2CF_3$ (R=0.44).

The dry etching gas according to the present invention is converted into a plasma gas for use in processing a material to be processed.

FIG. 1 is a schematic illustration of a dry etching device used in the present invention.

In FIG. 1, designated as 1 is a vacuum vessel, as 2 and 3 are a pair of flat plate electrodes, and as 4 is a material to be etched.

In dry etching the material to be processed using the dry etching device, the dry etching gas is introduced through a conduit 6 into the vacuum vessel 1 maintained in vacuum. A high frequency voltage is impressed between the electrodes 2 and 3 to form a plasma between the opposing electrodes 2 and 3, so that the introduced gas is decomposed and excited, thereby etching the material to be processed 4.

The dry etching gas according to the present invention may be used for various materials to be processed and is particularly advantageously used for semiconductor materials. As the semiconductor materials, there may be mentioned silicon dioxide, especially a silicon dioxide film formed on a surface of a silicon film or a polysilicon film.

The dry etching gas according to the present invention has an extremely short life when dispersed in air and, hence, scarcely causes a problem of global warming.

Life time in air and global warming factors of various fluorine-containing gases are shown in Table 1.

As will be appreciated from Table 1, the dry etching gases according to the present invention have an extremely short life in air and have improved effect of preventing global warming as compared with the conventional fluorine-containing etching gases.

TABLE 1

| Chemical Formula | C/F + O − H | Life in Air (year) | Global Warming Factor HGWP |
| --- | --- | --- | --- |
| $CF_4$ | 0.25 | 50,000 | 7.1 |
| $CHF_3$ | 0.50 | 264 | 7.0 |
| $C_2F_6$ | 0.33 | 10,000 | 10.0 |

TABLE 1-continued

| Chemical Formula | C/F + O − H | Life in Air (year) | Global Warming Factor HGWP |
|---|---|---|---|
| $C_3F_8$ | 0.38 | 2,600 | 7.2 |
| $C_4F_8$ | 0.50 | 3,200 | 9.1 |
| $CHF_2OCHF_2$ | 0.67 | 19 | 0.61 |
| $CF_3CHFOCF_3$ | 0.43 | 11 | 0.22 |
| $CH_3OCF_2CF_3$ | 1.0 | 1.2 | 0.024 |
| $CHF_2CF_2OCF_2CF_3$ | 0.44 | 6.8 | 0.13 |
| $CH_3OCF_2CF_2CF_3$ | 0.80 | 1.3 | 0.019 |

Remarks: Global warming parameter (HGWP):
value relative to CFC-11 whose global warming parameter is assigned to be 1.0.

EXAMPLES

The present invention will be further described in detail by examples.

Example 1

The etching device used for carrying out the present invention is as schematically illustrated in FIG. 1. A material to be etch-processed 4 was placed on a lower electrode 2 of a pair of opposing flat plate electrodes 2 and 3 disposed in a vacuum vessel 1. To the vacuum vessel 1 were fed an etching gas and $O_2$ at a total flow rate of 90 sccm and He at a flow rate of 10 sccm through a gas feed conduit 6, while maintaining the pressure within the vessel 1 at 60 mTorr. Then, a high frequency voltage (frequency: 400 KHz, Power: 600 W) was impressed to the electrodes from a high frequency electric power source 7 to generate a plasma between the opposing electrodes 2 and 3. Thus, the introduced gas was decomposed and excited so that the material to be processed 4 was etched. The following four kinds of gases were used for etching: HFE-134 ($CHF_2OCHF_2$), HFE-245 ($CH_3OCF_2CF_3$), HFE-329 ($CHF_2CF_2OCF_2CF_3$) and HFE-347 ($CH_3OCF_2CF_2CF_3$). The results of measurement of $SiO_2$ etching rate in the four kinds of HFE are shown in Table 2. The etching rate is an amount of $SiO_2$ removed from the surface of the $SiO_2$ per 1 minute and is expressed in terms of a thickness (Å) thereof.

TABLE 2

| Kind of Gas | Etching Rate (Å/minute) $O_2$ Concentration (%) | | | |
|---|---|---|---|---|
| | 0 | 10 | 30 | 50 |
| HFE-134 | 1413 | 1512 | 1028 | — |
| HFE-245 | x | — | 723 | 602 |
| HFE-329 | 3148 | — | 1107 | — |
| HFE-347 | x | x | x | x |

Remarks 1: $O_2$ Concentration (vol %) = [$O_2$/(HFE + $O_2$)] × 100
Remarks 2: "x" indicates that it was impossible to measure because of deposition of a polymerized material on the wafer
Remarks 3: "—" indicates that no measurement was performed

Example 2

A test was performed using HFE-329 ($CHF_2CF_2OCF_2CF_3$) under the same conditions ($O_2$ concentration: 0%) as those in Example 1 and using the same etching device as used in Example 1. In this test, a selectivity to Poly-Si and a selectivity to a photoresist were also measured in addition to an etching rate Of $SiO_2$.

The $SiO_2$ etching rate was found to be 3017 Å/minute. In this case, the selectivity to Poly-Si was 16.5 and the selectivity to the photoresist was 12.2. Thus, the $SiO_2$ etching rate and the selectivity were comparable to or superior to those attained by using the conventional etching gas. For the purpose of investigating an effect of addition of $O_2$, the amount of $O_2$ was increased from the above 0% to 10% and 20% while maintaining the total flow rate of HFE-329 plus $O_2$ at 90 sccm. As a result, in the case of the amount of $O_2$ of 10%, the $SO_2$ etching rate was 3176 Å/minute, the selectivity to Poly-Si was 1.7 and the selectivity to the photoresist was 1.3. Thus, addition of $O_2$ was not found to be effective.

The term "selectivity to Poly-Si" above is intended to refer to a ratio of the $SiO_2$ etching rate to the Poly-Si etching rate and the term "selectivity to the photoresist" is a ratio of the $SiO_2$ etching rate to the photoresist etching rate.

Example 3

Etching was performed using HFE-227 ($CF_3CHFOCF_3$) under the same conditions as those in Example 1 and using the same etching device as used in Example 1. In the case of the amount of $O_2$ of 0%, the $SiO_2$ etching rate was 3632 Å/minute, the selectivity to Poly-Si was 16.9 and the selectivity to the photoresist was 11.1. In the case of the amount of $O_2$ of 20%, the $SiO_2$ etching rate was 2147 Å/minute, the selectivity to Poly-Si was 1.5 and the selectivity to the photoresist was 1.2.

Similar to in Example 2, even with HFE-227 by itself, satisfactory $SiO_2$ etching rate and selectivity were obtained. The addition of $O_2$ was not found to be effective.

The dry etching gas according to the present invention shows etching effects comparable to or superior to the customarily employed fluorine-containing gas and, moreover, does not cause problems of serious global environmental problems such as global warming.

What is claimed is:
1. A method for dry etching a silicon dioxide film, said method comprising:

forming a plasma of $CF_3CHFOCF_3$ or $CHF_2CF_2OCF_2CF_3$; and contacting the silicon dioxide film with the plasma to dry etch the silicon dioxide film.

2. A dry etching method according to claim 1, wherein said silicon dioxide film is formed on a surface of a silicon or polysilicon film.

* * * * *